(12) United States Patent
Freeman et al.

(10) Patent No.: US 11,328,137 B2
(45) Date of Patent: May 10, 2022

(54) AUTONOMOUSLY IDENTIFYING AND LOCATING ELECTRONIC EQUIPMENT MODULES IN A RACK

(71) Applicant: THE BOEING COMPANY, Chicago, IL (US)

(72) Inventors: Roland N. Freeman, Goose Creek, SC (US); Brandon E. Wickline, Hanahan, SC (US); Rahul C. Thakkar, Leesburg, VA (US); Mark J. Boyer, Placentia, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 16/787,793

(22) Filed: Feb. 11, 2020

(65) Prior Publication Data

US 2021/0248333 A1 Aug. 12, 2021

(51) Int. Cl.
  *G06K 19/00* (2006.01)
  *G06K 7/10* (2006.01)
  *G06Q 10/08* (2012.01)
(52) U.S. Cl.
  CPC ....... *G06K 7/10297* (2013.01); *G06Q 10/087* (2013.01); *G06K 2007/10504* (2013.01)
(58) Field of Classification Search
  CPC ... H04L 67/12; G05B 13/028; G05B 19/4183; G05B 19/4184; G05B 19/41
  USPC ...................... 235/385, 360, 462.46, 472.02
  See application file for complete search history.

(56) References Cited

U.S. PATENT DOCUMENTS

| 8,463,888 B1 | 6/2013 | Boyer et al. |
| 9,740,897 B1 | 8/2017 | Salour et al. |
| 2007/0250410 A1 | 10/2007 | Brignone et al. |
| 2011/0248823 A1 | 10/2011 | Gamborg et al. |

(Continued)

FOREIGN PATENT DOCUMENTS

EP 2 642 437 A1 1/2013

OTHER PUBLICATIONS

Extended European Search Report dated Jul. 7, 2021 in the corresponding European Patent Application No. 21154264.2, 14 pages.

*Primary Examiner* — Daniel St. Cyr
(74) *Attorney, Agent, or Firm* — Womble Bond Dickinson (US) LLP

(57) ABSTRACT

A system is provided that includes a rack including mount positions to accept electronic equipment modules that are rack mountable and equipped with respective RFID tags, and a RFID reader array including RFID readers each of which is associated with a respective mount position, and has a read field that among the mount positions extends into only the respective mount position. Processing circuitry causes an RFID reader to radiate an interrogation signal within its read field, and in response, receive module identifiable information from an RFID tag of an electronic equipment module mounted at the mount position. A signal including the module identifiable information and mount position identifiable information is transmitted to the processing circuitry, and a second signal to a computer configured to identify the electronic equipment module from the module identifiable information, and locate the electronic equipment module at the mount position from the mount position identifiable information.

24 Claims, 4 Drawing Sheets

(56) References Cited

U.S. PATENT DOCUMENTS

| | | |
|---|---|---|
| 2015/0236512 A1 | 8/2015 | Whitney |
| 2017/0126505 A1* | 5/2017 | Cencini .................. H04L 67/22 |
| 2017/0192928 A1* | 7/2017 | Arnouse ............ H05K 7/20709 |
| 2017/0214117 A1* | 7/2017 | Gracyk ................. G01S 13/767 |
| 2019/0026690 A1* | 1/2019 | Wappler ................. G06Q 50/04 |
| 2019/0168392 A1* | 6/2019 | Vain ..................... B65G 1/0407 |
| 2019/0340269 A1 | 11/2019 | Biernat et al. |

\* cited by examiner

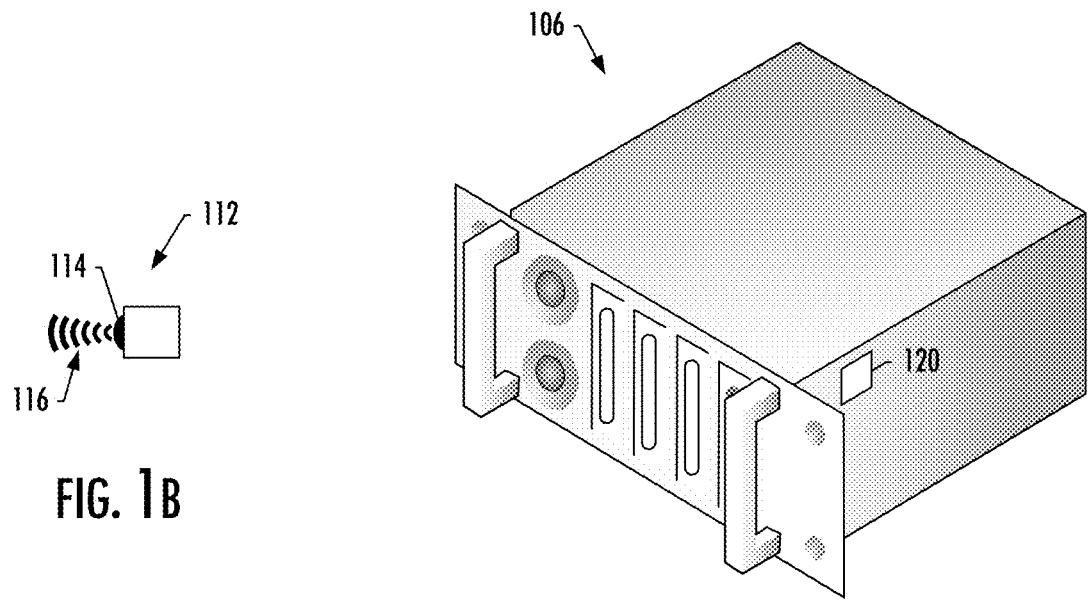
FIG. 1B
FIG. 1C
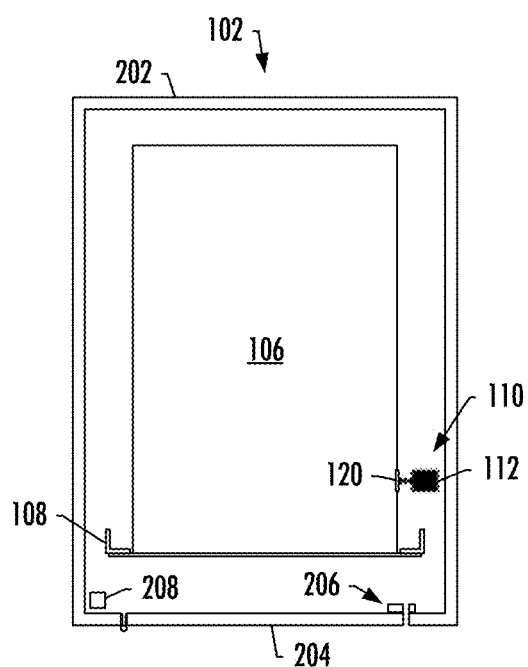
FIG. 2

AUTONOMOUSLY IDENTIFYING AND LOCATING ELECTRONIC EQUIPMENT MODULES IN A RACK

TECHNOLOGICAL FIELD

The present disclosure relates generally to asset management and, in particular, to autonomously identifying and locating electronic equipment modules in a rack.

BACKGROUND

In the digital age, industries are becoming increasingly reliant on computer systems and associated equipment such as computer servers, computer data storage, telecommunications equipment and networking hardware, audiovisual production and scientific equipment, and the like. Electronic equipment modules of these computer systems and associated equipment are often mounted in racks. An installation may include a single rack or multiple racks with a relatively small number of electronic equipment modules. Dedicated data center facilities may include thousands of racks, and a standard rack may hold tens of electronic equipment modules (depending on their heights).

The current method for tracking electronic equipment in an installation includes recording each electronic equipment module in each rack. The current record-keeping method relies on manual data entry, and updating of spreadsheets. The current method is tedious, error prone, and labor intensive for data centers with large numbers of racks of electronic equipment. Furthermore, the current method does not account for movement of modules within an installation, which limits is accuracy to when the inventory is taken in the first place.

Therefore, it would be desirable to have a system and method that takes into account at least some of the issues discussed above, as well as other possible issues.

BRIEF SUMMARY

Example implementations of the present disclosure are directed to asset management and, in particular, to autonomously identifying and locating electronic equipment modules in a rack. According to example implementations, a rack may be equipped with a radio-frequency identification (RFID) reader array that extends across the mount positions of the rack. Similarly, electronic equipment modules may be equipped with RFID tags on which respective module identifiable information for the electronic equipment modules are stored. RFID readers of the RFID reader array may be caused to autonomously read any RFID tags of electronic equipment modules mounted at mount positions. And from an RFID reader associated with a mount position, and the module identifiable information from an RFID tag on an electronic equipment module at that mount position, the electronic equipment module may be identified and located at the mount position. Example implementations may therefore autonomously inventory electronic equipment modules in a manner that is less error-prone than the current method, and that may account for movement of modules within an installation of one or more racks.

The present disclosure thus includes, without limitation, the following example implementations.

Some example implementations provide a system comprising a rack including mount positions configured to accept electronic equipment modules that are rack mountable; a radio-frequency identification (RFID) reader array extending across the mount positions of the rack, the RFID reader array including RFID readers that are separate and distinct, each RFID reader associated with a respective mount position, including a directional antenna that is configured to radiate toward the respective mount position, and having a read field that among the mount positions extends into only the respective mount position; and processing circuitry configured to cooperate with the RFID reader array to autonomously identify and locate the electronic equipment modules mounted at respective mount positions of the rack, the electronic equipment modules equipped with respective RFID tags on which respective module identifiable information for the electronic equipment modules are stored, wherein the processing circuitry is configured to cause an RFID reader of the RFID readers to radiate an interrogation signal within the read field of the RFID reader, and in response, the RFID reader associated with a mount position is configured to receive module identifiable information from an RFID tag of an electronic equipment module mounted at the mount position, and transmit a signal including the module identifiable information and mount position identifiable information to the processing circuitry, and wherein the processing circuitry is configured to transmit a second signal including at least the module identifiable information and the mount position identifiable information to a computer configured to identify the electronic equipment module from the module identifiable information, and locate the electronic equipment module at the mount position from the mount position identifiable information.

In some example implementations of the system of any preceding example implementation, or any combination of any preceding example implementations, the RFID reader array further comprises a backplane or hub configured to connect the RFID readers to the processing circuitry.

In some example implementations of the system of any preceding example implementation, or any combination of any preceding example implementations, the module identifiable information from the RFID tag of the electronic equipment module includes a unique identifier (UID) of the electronic equipment module, and system further comprises the computer that is configured to access information about the electronic equipment module using the UID.

In some example implementations of the system of any preceding example implementation, or any combination of any preceding example implementations, the module identifiable information from the RFID tag of the electronic equipment module includes one or more of a make, a model, a serial number, a description of the electronic equipment module, or a description of one or more components of the electronic equipment module.

In some example implementations of the system of any preceding example implementation, or any combination of any preceding example implementations, the processing circuitry is configured to cause the RFID readers to radiate interrogation signals periodically.

In some example implementations of the system of any preceding example implementation, or any combination of any preceding example implementations, the rack includes a door configured to allow access to the mount positions, and a sensor configured to detect when the door is opened and generate a corresponding signal, and wherein the processing circuitry is configured to receive the corresponding signal, and in direct response thereto, cause the RFID readers to radiate respective interrogation signals, or change a frequency at which the RFID readers radiate respective interrogation signals.

In some example implementations of the system of any preceding example implementation, or any combination of any preceding example implementations, the system further comprises a motion sensor located in an area including the rack, and configured to detect motion in the area and generate a corresponding signal, and wherein the processing circuitry is configured to receive the corresponding signal, and in direct response thereto, cause the RFID readers to radiate respective interrogation signals, or change a frequency at which the RFID readers radiate respective interrogation signals.

In some example implementations of the system of any preceding example implementation, or any combination of any preceding example implementations, the rack, the RFID reader array and the processing circuitry are components of a rack assembly, and the system comprises a plurality of rack assemblies, and wherein the second signal further includes rack identifiable information, and the computer configured to locate the electronic equipment module includes the computer configured to locate the electronic equipment in the rack and at the mount position, from respectively the rack identifiable information and the mount position identifiable information.

In some example implementations of the system of any preceding example implementation, or any combination of any preceding example implementations, the system further comprises the computer configured to communicate inventory information including at least some of the module identifiable information, the rack identifiable information and the mount position identifiable information to an inventory management system configured to track inventory of electronic equipment modules mounted in the plurality of rack assemblies.

In some example implementations of the system of any preceding example implementation, or any combination of any preceding example implementations, the system further comprises the inventory management system that is configured to implement a distributed ledger that is replicated, shared and synchronized across a plurality of nodes on a peer-to-peer network, and wherein the inventory management system is configured to record the inventory information in an immutable entry in the distributed ledger.

In some example implementations of the system of any preceding example implementation, or any combination of any preceding example implementations, the system further comprises the computer configured to communicate product lifecycle information including at least some of the module identifiable information, the rack identifiable information and the mount position identifiable information to a product lifecycle management system configured to identify and localize electronic equipment modules at different points of time during a lifecycle of the electronic equipment modules.

In some example implementations of the system of any preceding example implementation, or any combination of any preceding example implementations, the system further comprises the product lifecycle management system that is configured to implement a distributed ledger that is replicated, shared and synchronized across a plurality of nodes on a peer-to-peer network, and wherein product lifecycle management system is configured to record the product lifecycle information in an immutable entry in the distributed ledger.

Some example implementations provide a method of autonomously identifying and locating electronic equipment modules in a rack including mount positions configured to accept the electronic equipment modules that are rack mountable, the electronic equipment modules equipped with respective radio-frequency identification (RFID) tags on which respective module identifiable information for the electronic equipment modules are stored, the method comprising causing an RFID reader of an RFID reader array to radiate an interrogation signal within a read field of the RFID reader, the RFID reader array extending across the mount positions of the rack, the RFID reader array including RFID readers that are separate and distinct, each RFID reader associated with a respective mount position, including a directional antenna that is configured to radiate toward the respective mount position, and having the read field that among the mount positions extends into only the respective mount position; receiving module identifiable information at the RFID reader associated with a mount position, from an RFID tag of an electronic equipment module mounted at the mount position; transmitting a signal including the module identifiable information and mount position identifiable information, from the RFID reader to processing circuitry; and transmitting a second signal including at least the module identifiable information and the mount position identifiable information, from the processing circuitry to a computer configured to identify the electronic equipment module from the module identifiable information, and locate the electronic equipment module at the mount position from the mount position identifiable information.

In some example implementations of the method of any preceding example implementation, or any combination of any preceding example implementations, the RFID reader array further comprises a backplane or hub configured to connect the RFID readers to the processing circuitry, and causing the RFID reader to radiate the interrogation signal includes the processing circuitry instructing the RFID reader via the backplane or hub.

In some example implementations of the method of any preceding example implementation, or any combination of any preceding example implementations, the module identifiable information from the RFID tag of the electronic equipment module includes a unique identifier (UID) of the electronic equipment module, and method further comprises the computer accessing information about the electronic equipment module using the UID.

In some example implementations of the method of any preceding example implementation, or any combination of any preceding example implementations, the module identifiable information from the RFID tag of the electronic equipment module includes one or more of a make, a model, a serial number, a description of the electronic equipment module, or a description of one or more components of the electronic equipment module.

In some example implementations of the method of any preceding example implementation, or any combination of any preceding example implementations, the method further comprises causing the RFID readers to radiate interrogation signals periodically.

In some example implementations of the method of any preceding example implementation, or any combination of any preceding example implementations, the rack includes a door configured to allow access to the mount positions, and the method further comprises detecting when the door is opened; and in direct response thereto, causing the RFID readers to radiate respective interrogation signals, or change a frequency at which the RFID readers radiate respective interrogation signals.

In some example implementations of the method of any preceding example implementation, or any combination of any preceding example implementations, the method further comprises detecting motion in an area including the rack;

and in direct response thereto, causing the RFID readers to radiate respective interrogation signals, or change a frequency at which the RFID readers radiate respective interrogation signals.

In some example implementations of the method of any preceding example implementation, or any combination of any preceding example implementations, the rack, the RFID reader array and the processing circuitry are components of a rack assembly of a plurality of rack assemblies, and wherein the second signal transmitted from the processing circuitry to the computer further includes rack identifiable information, and the computer configured to locate the electronic equipment module includes the computer configured to locate the electronic equipment in the rack and at the mount position, from respectively the rack identifiable information and the mount position identifiable information.

In some example implementations of the method of any preceding example implementation, or any combination of any preceding example implementations, the method further comprises the computer communicating inventory information including at least some of the module identifiable information, the rack identifiable information and the mount position identifiable information to an inventory management system configured to track inventory of electronic equipment modules mounted in the plurality of rack assemblies.

In some example implementations of the method of any preceding example implementation, or any combination of any preceding example implementations, the method further comprises implementing a distributed ledger that is replicated, shared and synchronized across a plurality of nodes on a peer-to-peer network; and recording the inventory information in an immutable entry in the distributed ledger.

In some example implementations of the method of any preceding example implementation, or any combination of any preceding example implementations, the method further comprises the computer communicating product lifecycle information including at least some of the module identifiable information, the rack identifiable information and the mount position identifiable information to a product lifecycle management system configured to identify and localize electronic equipment modules at different points of time during a lifecycle of the electronic equipment modules.

In some example implementations of the method of any preceding example implementation, or any combination of any preceding example implementations, the method further comprises implementing a distributed ledger that is replicated, shared and synchronized across a plurality of nodes on a peer-to-peer network; and recording the product lifecycle information in an immutable entry in the distributed ledger.

These and other features, aspects, and advantages of the present disclosure will be apparent from a reading of the following detailed description together with the accompanying figures, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying figures which illustrate, by way of example, the principles of some described example implementations.

BRIEF DESCRIPTION OF THE FIGURE(S)

Having thus described example implementations of the disclosure in general terms, reference will now be made to the accompanying figures, which are not necessarily drawn to scale, and wherein:

FIG. 1B and FIG. 1C illustrate respectively an RFID reader and electronic equipment module, according to example implementations;

FIG. 2 illustrates a top-view of a rack of the system shown in FIG. 1, according to some example implementations;

DETAILED DESCRIPTION

Figure 1A:
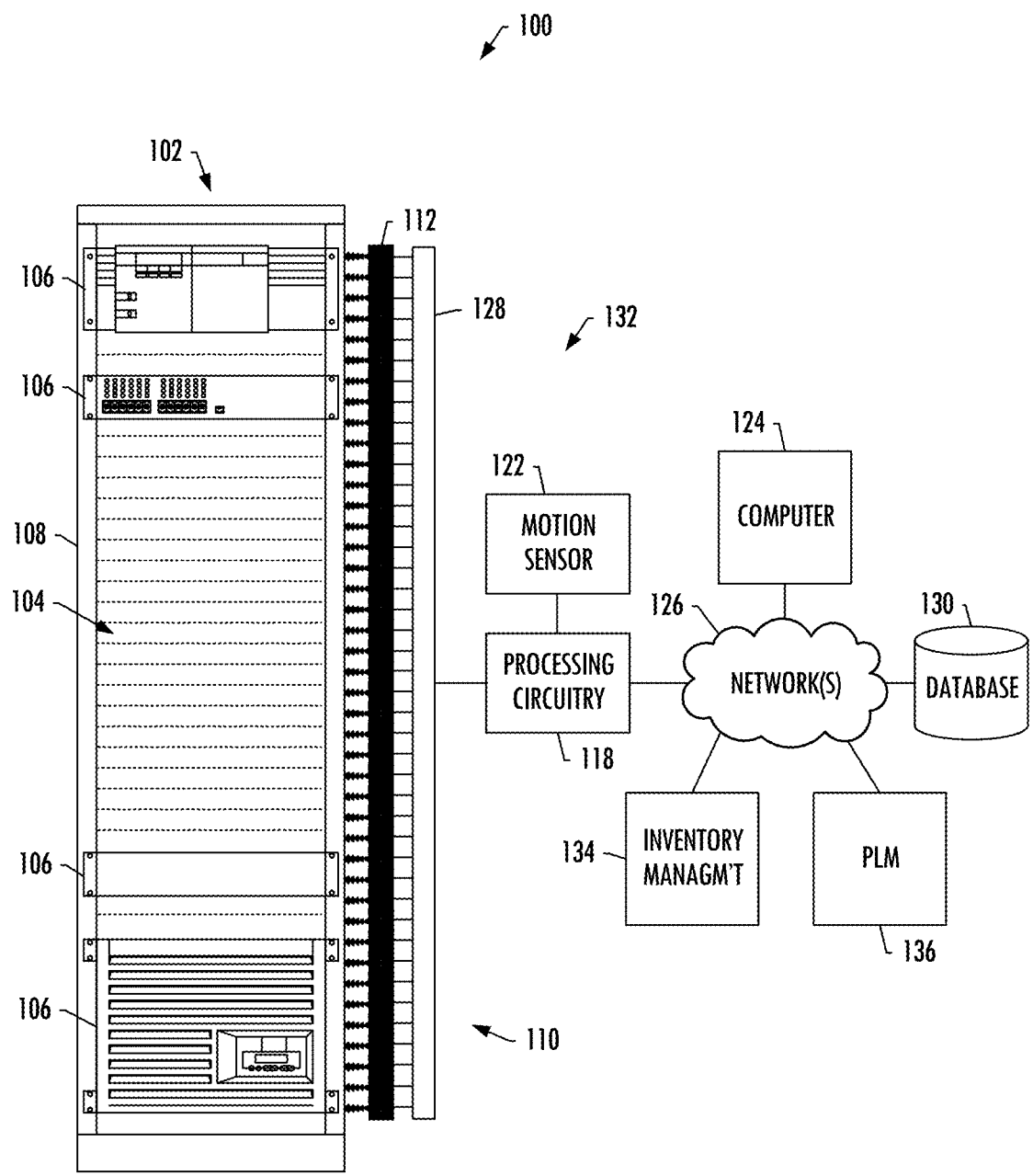
FIG. 1A illustrates a system according to example implementations of the present disclosure.

Some implementations of the present disclosure will now be described more fully hereinafter with reference to the accompanying figures, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless specified otherwise or clear from context, references to first, second or the like should not be construed to imply a particular order. A feature may be described as being above another feature (unless specified otherwise or clear from context) may instead be below, and vice versa; and similarly, features described as being to the left of another feature else may instead be to the right, and vice versa. As used herein, unless specified otherwise or clear from context, the "or" of a set of operands is the "inclusive or" and thereby true if and only if one or more of the operands is true, as opposed to the "exclusive or" which is false when all of the operands are true. Thus, for example, "[A] or [B]" is true if [A] is true, or if [B] is true, or if both [A] and [B] are true. Further, the articles "a" and "an" mean "one or more," unless specified otherwise or clear from context to be directed to a singular form. Like reference numerals refer to like elements throughout Example implementations of the present disclosure are directed to asset management and, in particular, to autonomously identifying and locating electronic equipment modules in a rack. Example implementations may be applied to any of a number of different racks of any of a number of different electronic equipment modules. A rack is generally a frame or enclosure for mounting electronic equipment modules. And examples of suitable electronic equipment modules include computer servers, computer data storage, telecommunications equipment and networking hardware, audiovisual production and scientific equipment, and the like FIG. 1A illustrates a system 100 according to some example implementations of the present disclosure. The system may include any of a number of different subsystems (each an individual system) for performing one or more functions or operations. As shown, in some examples, the system includes a rack 102 with mount positions 104 (one of which is called out in the figure) configured to accept electronic equipment modules 106 that are rack mountable. In some examples, the mount positions are defined in rack units (U or RU). The electronic equipment modules may cover a mount position, or in some example, span more than one mount position. The rack may include a rack frame 108 to which the electronic equipment modules may be secured with screws or other fasteners. As also shown, the system includes a radio-frequency identification (RFID) reader array 110 extending across the mount positions of the rack.

The RFID reader array 110 includes RFID readers 112 (one of which is called out in the figure) that are separate and distinct, and each RFID reader is associated with a respective mount position 104 of the rack 102. As shown more particularly FIG. 1B, each RFID reader includes a directional antenna 114 that is configured to radiate toward the respective mount position. Each RFID reader has a read field 116 that among the mount positions of the rack extends into only the respective mount position. The read field is the area of coverage of the RFID reader, and only RFID tags within the read field receive signals from the RFID reader and can be read. The read field is sometimes referred to as the interrogation zone, which in the case of a passive RFID reader and passive RFID tag, is the area in which the passive RFID reader can provide enough energy to power up the passive RFID tag and receive information back from the passive RFID tag.

The system 100 also includes processing circuitry 118 configured to cooperate with the RFID reader array 110 to autonomously identify and locate the electronic equipment modules 106 mounted at respective mount positions 104 of the rack 102. The processing circuitry may include one or more processors alone or in combination with one or more memories. The processing circuitry is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits (an integrated circuit at times more commonly referred to as a "chip"). The processing circuitry may be configured to execute computer programs, which may be stored onboard the processing circuitry or otherwise stored in memory accessible to the processing circuitry.

The electronic equipment modules 106 are equipped with respective RFID tags 120 on which respective module identifiable information for the electronic equipment modules are stored, as shown in FIG. 1C for one of the electronic equipment modules. The processing circuitry 118 is configured to cause one or more of the RFID readers 112 to read any RFID tags of electronic equipment modules mounted at mount positions 104 with which the RFID readers are associated, and thereby identify and locate those electronic equipment modules. In particular, the processing circuitry is configured to cause the RFID readers to radiate interrogation signals within their respective read fields 116, to identify and locate any electronic equipment modules mounted at those mount positions. The processing circuitry may cause any of the RFID readers to radiate an interrogation signal on-demand, cause the RFID readers to radiate interrogation signals simultaneously or in a sequence. In some examples, the processing circuitry is configured to cause the RFID readers to radiate interrogation signals periodically.

In some examples, the processing circuitry 118 is event-driven to cause the RFID readers 112 radiate interrogation signals. These events may include those that indicate an electronic equipment module 106 is being mounted in or removed from the rack 102, or moved from one mount position 104 to another mount position in the rack. Examples of suitable events may include those that indicate the rack is being accessed, those that indicate movement in an area including the rack, and the like.

FIG. 2 illustrates a top-view of the rack 102 that in some examples may include an enclosure 202 for the rack frame 108 and the electronic equipment modules 106 (equipped with RFID tags 120) that are mounted in the rack; and as shown, the RFID reader array 110 of RFID readers 112 may also be within the enclosure. In some examples, the rack 102 includes a door 204 configured to allow access to the mount positions 104, and a sensor configured to detect when the door is opened and generate a corresponding signal. Examples of a suitable sensor include a contact sensor 206 configured to detect when the door is opened, a light sensor 208 configured to detect light entering the enclosure from the doorway of the enclosure from which it may be inferred the door is open, or the like. In some examples including the sensor, the processing circuitry 118 is configured to receive the corresponding signal from the sensor, and in direct response thereto, cause the RFID readers 112 to radiate respective interrogation signals, or change a frequency at which the RFID readers radiate respective interrogation signals.

Returning to FIG. 1A, in some examples, the system 100 further includes a motion sensor 122 located in an area including the rack 102. In some of these examples, the motion sensor is configured to detect motion in the area and generate a corresponding signal. The processing circuitry 118 is configured to receive the corresponding signal, and in direct response thereto, cause the RFID readers 112 to radiate respective interrogation signals, or change a frequency at which the RFID readers radiate respective interrogation signals.

A motion sensor 122 such as a directed motion sensor, and a location triangulator along a length of the rack 102 (or the length of rack assemblies—described below), may permit localizing a rack (or section of rack assemblies) where work may be occurring. Another example of a suitable motion sensor is a stereo or computer-vision-aided camera configured to detect motion, type of motion and qualify a particular rack (or rack assemblies). In some examples, the frequency at which the RFID readers 112 radiate interrogation signals may increase as motion increases. Conversely, in some examples, the frequency at which the RFID readers radiate interrogation signals may decrease as motion decreases, following a programmable amount of time after motion has decreased to a stand-still, or the like.

According to some example implementations of the present disclosure, then, the processing circuitry 118 is configured to cause an RFID reader 112 of the RFID readers to radiate an interrogation signal within the read field 116 of the RFID reader. In response, the RFID reader associated with a mount position 104 is configured to receive module identifiable information from an RFID tag 120 of an electronic equipment module 106 mounted at the mount position. The RFID reader is configured to transmit a signal including the module identifiable information and mount position identifiable information to the processing circuitry. The processing circuitry is configured to transmit a second signal including at least the module identifiable information and the mount position identifiable information to a computer 124. The computer is configured to identify the electronic equipment module from the module identifiable information, and locate the electronic equipment module at the mount position from the mount position identifiable information. In various examples, the computer may be part of the system 100 or external to but configured to communicate with the system.

One or more of the subsystems of the system 100, such as the rack 102, RFID reader array 110, processing circuitry 118, and in some examples the computer 124, may be co-located or directly coupled to one another, either by wire or wirelessly. In some examples, various ones of the subsystems may communicate with one another across one or more computer networks 126. In a particular example, as shown, the RFID reader array further includes a backplane or hub 128 configured to connect the RFID readers 112 to the processing circuitry. As also shown, in a particular example, the processing circuitry and the computer are configured to communicate across one or more computer networks. In another particular example, the processing circuitry and the computer are co-located, and connected to the RFID readers (and thereby the RFID reader array) via the backplane or hub. The processing circuitry in some examples, then, may instruct the RFID reader via the backplane or hub to thereby cause the RFID reader to radiate the interrogation signal. Further, although shown as part of the system, it should be understood that any one or more of the subsystems may function or operate as a separate system without regard to any of the other subsystems, tools and the like. It should also be understood that the system may include one or more additional or alternative subsystems than those shown in FIG. 2. Examples of suitable additional subsystems are described in greater detail below.

In some examples, the module identifiable information from the RFID tag 120 of the electronic equipment module 106 includes a unique identifier (UID) of the electronic equipment module. Additionally or alternatively, in some examples, the module identifiable information from the RFID tag of the electronic equipment module includes one or more of a make, a model, a serial number, a description of the electronic equipment module (i.e., a module description), or a description of one or more components of the electronic equipment module (i.e., a component description). In some of these examples, the system 100 further includes the computer 124 that is configured to access information about the electronic equipment module using the module identifiable information such as the UID, such as from a database 130 or another suitable system such as those described below.

Figure 3:
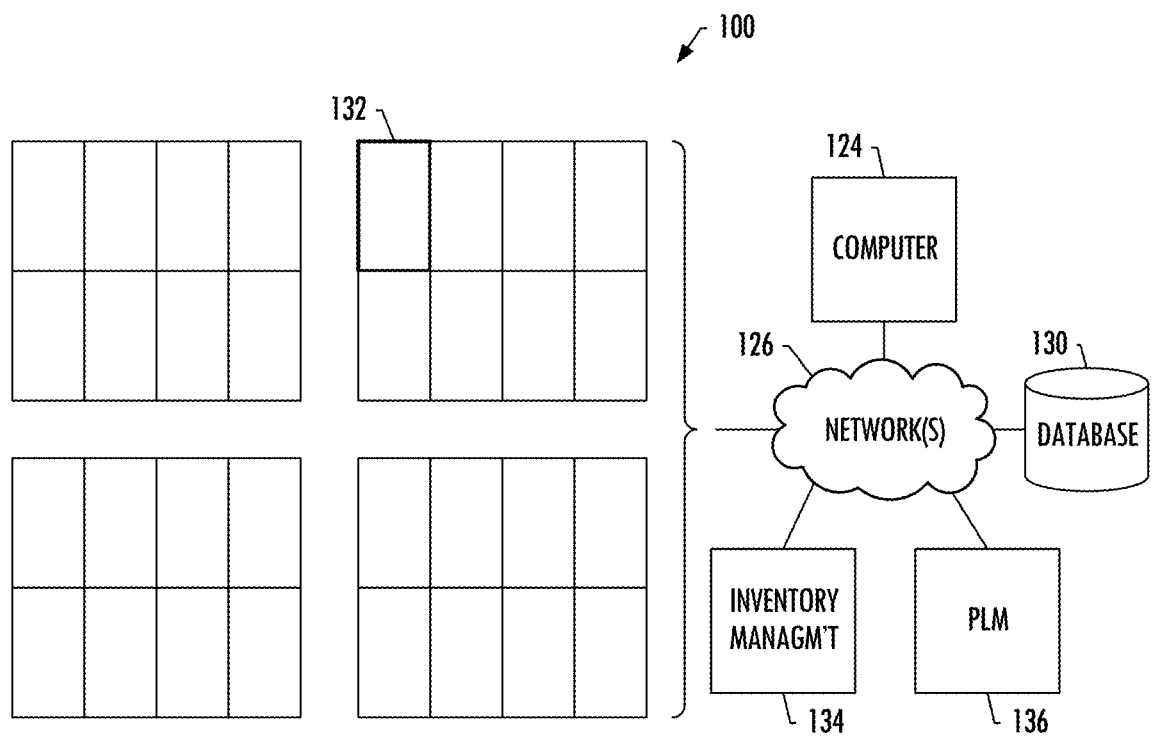
FIG. 3 illustrates a system including a plurality of rack assemblies, according to some example implementations.

In some examples, at least the rack 102, the RFID reader array 110 and the processing circuitry 118 are components of a rack assembly 132, and the system 100 includes a plurality of rack assemblies. FIG. 3 illustrates the system 100 in an example in which the system includes a plurality of rack assemblies (one of which is separately called out) with respective processing circuitry (not shown). As shown, the rack assemblies are coupled to the computer 124 directly or via network(s) 126. In some of these examples, the second signal (from the processing circuitry to the computer 124) further includes rack identifiable information, and the computer is configured to locate the electronic equipment module 106 in the rack and at the mount position 104, from respectively the rack identifiable information and the mount position identifiable information.

As shown in FIG. 1 and FIG. 3, in some examples, the computer 124 is configured to communicate inventory information including at least some of the module identifiable information, the rack identifiable information and the mount position identifiable information. In particular, for example, the computer is configured to transmit this inventory information to an inventory management system 134 configured to track inventory of electronic equipment modules 106 mounted in one or more rack assemblies 132, or the plurality of rack assemblies. Similarly, in some examples, the computer is configured to communicate product lifecycle information including at least some of the module identifiable information, the rack identifiable information and the mount position identifiable information, which the computer is configured to transmit this lifecycle information to a product lifecycle management (PLM) system 136. The PLM system, in turn, is configured to identify and localize electronic equipment modules 106 at different points of time during a lifecycle of the electronic equipment modules.

Figure 4:
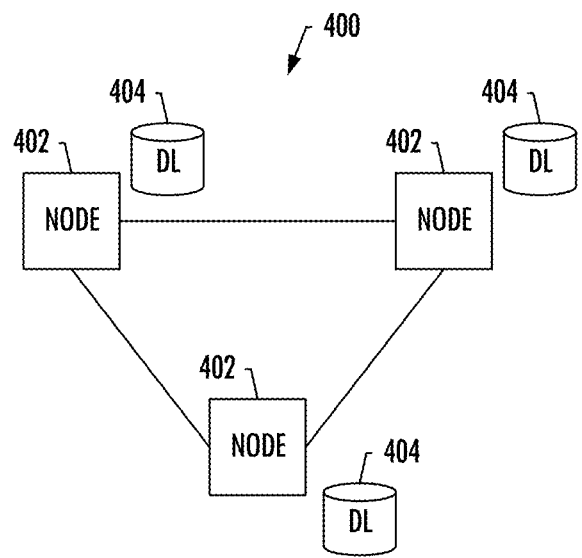
FIG. 4 illustrates a peer-to-peer network according to some example implementations.

In some examples implementations, one or more of the computer 124, inventory management system 134 or PLM system 136 may further include a distributed ledger (DL). FIG. 4 illustrates a peer-to-peer network 400 including a plurality of network nodes 402, and one of the network nodes may correspond or be configured to communicate with the computer, inventory management system or PLM system. The DL s replicated, shared and synchronized across the network nodes 402 of the peer-to-peer network 400. The DL is a consensus of replicated, shared and synchronized digital data spread across the network nodes. In some examples, the DL is implemented as a database spread across the nodes, each of which replicates and saves a respective local copy of the DL and independently updates it. The DL and thereby each respective local copy includes immutable entries of digital data, where immutable is defined as unchangeability of the digital data stored in the DL.

The DL 404 may be implemented as a blockchain, which is a continuously growing list of immutable entries (records), called blocks, that are linked and secured using cryptography. Each block in a blockchain may contain a cryptographic hash of a previous block, a timestamp, and transaction data. A blockchain is inherently resistant to modification of the digital data stored in the blockchain. A blockchain may be used as a decentralized, distributed, and public or private permissions based digital ledger for recording data across the network nodes 402 of the peer-to-peer network 400.

The DL 404 may provide event-level traceability, event-triggered activity, and communicate information about the electronic equipment modules 106. Similar to above, this may include events that indicate an electronic equipment module 106 is being mounted in or removed from the rack 102, or moved from one mount position 104 to another mount position in the rack. It may likewise include events that trace the electronic equipment module at different points of time during its lifecycle, such as from manufacturing to the area including the rack, and then into the rack in which the electronic equipment module is mounted, removed from or moved within. The information about the electronic equipment modules may include module identifiable information (e.g., UID, make, model, serial number, module description, component description), mount position identifiable information, rack identifiable information, inventory information, product lifecycle information, or some combination thereof.

In some examples in which a network node 402 corresponds or is configured to communicate with the computer 124, inventory management system 134 or PLM system 136, the computer, inventory management system or PLM system may be configured to implement a DL 404. In some of these examples, the computer, inventory management system or PIM system may be event-triggered to record module identifiable information, mount position identifiable information or rack identifiable information, in an immutable entry in the DL, such as in a separate immutable entry per event. In some examples, the inventory management system is configured to record inventory information in an immutable entry in the distributed ledger. Similarly, in some examples, the PLM system is configured to record the product lifecycle information in an immutable entry in the DL.

Figure 5:
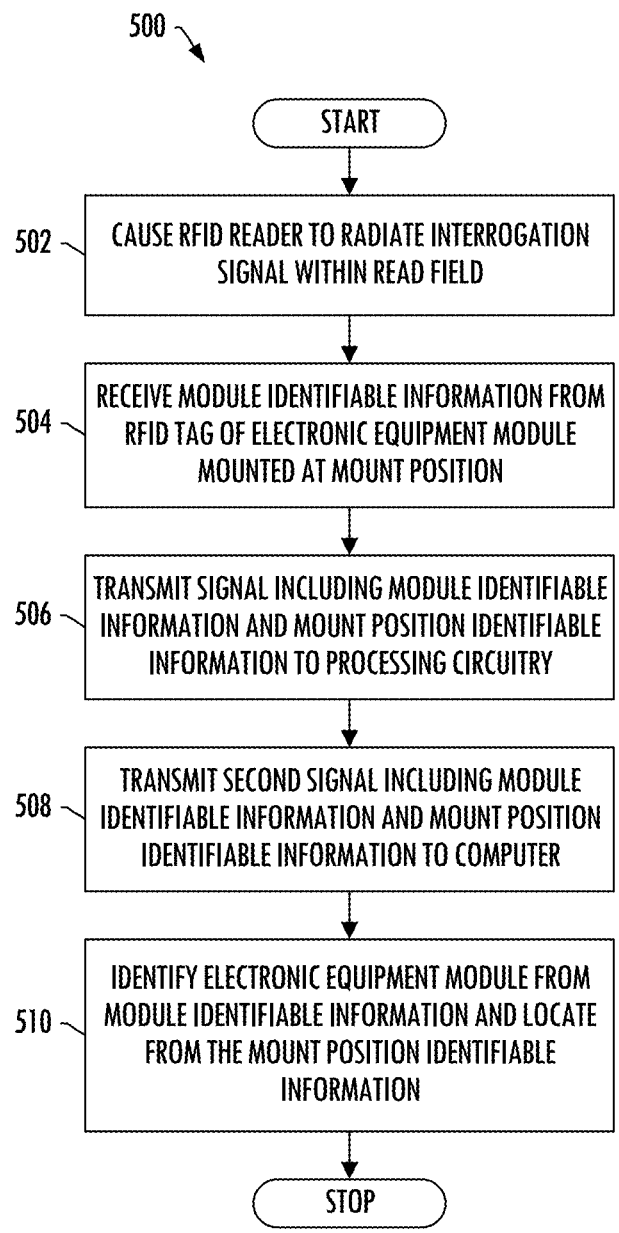
FIG. 5 is a flowchart illustrating various operations in a method of autonomously identifying and locating electronic equipment modules in a rack, according to example implementations.

FIG. 5 is a flowchart illustrating various operations in a method 500 of autonomously identifying and locating electronic equipment modules 106 in a rack 102, according to example implementations of the present disclosure. As explained above, the rack includes mount positions 104 configured to accept the electronic equipment modules that are rack mountable. The electronic equipment modules are equipped with respective radio-frequency identification RFID tags 120 on which respective module identifiable information for the electronic equipment modules are stored. As shown at block 502, the method includes causing an RFID reader 112 of an RFID reader array 110 to radiate an interrogation signal within the read field 116 of the RFID reader. In this regard, the RFID reader array extends across the mount positions of the rack, and includes RFID readers that are separate and distinct. Each RFID reader is associated with a respective mount position, includes a directional antenna 114 that is configured to radiate toward the respective mount position, and has a read field that among the mount positions extends into only the respective mount position.

As shown at block 504, the method 500 also includes receiving module identifiable information at the RFID reader 112 associated with a mount position 104, from an RFID tag 120 of an electronic equipment module 106 mounted at the mount position. The method includes transmitting a signal including the module identifiable information and mount position identifiable information, from the RFID reader to processing circuitry 118, as shown at block 506. And the method includes transmitting a second signal including at least the module identifiable information and the mount position identifiable information, from the processing circuitry to a computer 124, as shown at block 508. The computer, then, is configured to identify the electronic equipment module from the module identifiable information, and locate the electronic equipment module at the mount position from the mount position identifiable information, as shown at block 510.

According to example implementations of the present disclosure, the computer 124, database 130, inventory management system 134 and PLM system 136 may be implemented or otherwise executed by various means. These means may include hardware, alone or under direction of one or more computer programs from a computer-readable storage medium. In some examples, one or more apparatuses may be configured to function as or otherwise implement one or more of the computer, database, inventory management system and PLM system, shown and described herein.

An apparatus according to some example implementations of the present disclosure may comprise, include or be embodied in one or more fixed or portable electronic devices. Examples of suitable electronic devices include computers such as desktop computers, server computers, portable computers (e.g., laptop computer, tablet computer), mobile phones (e.g., cell phone, smartphone), wearable computers (e.g., smartwatch), or the like. The apparatus may include one or more of each of a number of components such as, for example, processing circuitry (e.g., processor unit) connected to a memory (e.g., storage device).

The processing circuitry may be similar to or different from the processing circuitry 118 of the system 100. Like the processing circuitry of the system, the processing circuitry of the apparatus is generally any piece of computer hardware that is capable of processing information such as, for example, data, computer programs and/or other suitable electronic information. The processing circuitry is composed of a collection of electronic circuits some of which may be packaged as an integrated circuit or multiple interconnected integrated circuits. The processing circuitry may be configured to execute computer programs, which may be stored onboard the processing circuitry or otherwise stored in the memory (of the same or another apparatus).

The processing circuitry may be a number of processors, a multi-core processor or some other type of processor, depending on the particular implementation. Further, the processing circuitry may be implemented using a number of heterogeneous processor systems in which a main processor is present with one or more secondary processors on a single chip. As another illustrative example, the processing circuitry may be a symmetric multi-processor system containing multiple processors of the same type. In yet another example, the processing circuitry may be embodied as or otherwise include one or more ASICs, FPGAs or the like. Thus, although the processing circuitry may be capable of executing a computer program to perform one or more functions, the processing circuitry of various examples may be capable of performing one or more functions without the aid of a computer program. In either instance, the processing circuitry may be appropriately programmed to perform functions or operations according to example implementations of the present disclosure.

The memory is generally any piece of computer hardware that is capable of storing information such as, for example, data, computer programs (e.g., computer-readable program code) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk-read only memory (CD-ROM), compact disk-read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory, the processing circuitry may also be connected to one or more interfaces for displaying, transmitting and/or receiving information. The interfaces may include a communications interface (e.g., communications unit) and/or one or more user interfaces. The communications interface may be configured to transmit and/or receive information, such as to and/or from other apparatus (es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display and/or one or more user input interfaces (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like.

As indicated above, program code instructions may be stored in memory, and executed by processing circuitry that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processing circuitry or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processing circuitry or other programmable apparatus to configure the computer, processing circuitry or other programmable apparatus to execute operations to be performed on or by the computer, processing circuitry or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processing circuitry or other programmable apparatus provide operations for implementing functions described herein.

Execution of instructions by a processing circuitry, or storage of instructions in a computer-readable storage medium, supports combinations of operations for performing the specified functions. In this manner, an apparatus may include a processing circuitry and a computer-readable storage medium or memory coupled to the processing circuitry, where the processing circuitry is configured to execute computer-readable program code stored in the memory. It will also be understood that one or more functions, and combinations of functions, may be implemented by special purpose hardware-based computer systems and/or processing circuitry s which perform the specified functions, or combinations of special purpose hardware and program code instructions.

Many modifications and other implementations of the disclosure set forth herein will come to mind to one skilled in the art to which the disclosure pertains having the benefit of the teachings presented in the foregoing description and the associated figures. Therefore, it is to be understood that the disclosure is not to be limited to the specific implementations disclosed and that modifications and other implementations are intended to be included within the scope of the appended claims. Moreover, although the foregoing description and the associated figures describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A system comprising:
    a rack including mount positions configured to accept electronic equipment modules that are rack mountable;
    a radio-frequency identification (RFID) reader array extending across the mount positions of the rack, the RFID reader array including RFID readers that are separate and distinct, each RFID reader associated with a respective mount position, including a directional antenna that is configured to radiate toward the respective mount position, and having a read field that among the mount positions extends into only the respective mount position; and
    processing circuitry configured to cooperate with the RFID reader array to autonomously identify and locate the electronic equipment modules mounted at respective mount positions of the rack, the electronic equipment modules equipped with respective RFID tags on which respective module identifiable information for the electronic equipment modules are stored,
    wherein the processing circuitry is configured to cause an RFID reader of the RFID readers to radiate an interrogation signal within the read field of the RFID reader, and in response, the RFID reader associated with a mount position is configured to receive module identifiable information from an RFID tag of an electronic equipment module mounted at the mount position, and transmit a signal including the module identifiable information and mount position identifiable information to the processing circuitry, and
    wherein the processing circuitry is configured to transmit a second signal including at least the module identifiable information and the mount position identifiable information to a computer configured to identify the electronic equipment module from the module identifiable information, and locate the electronic equipment module at the mount position from the mount position identifiable information.

2. The system of claim 1, wherein the RFID reader array further comprises a backplane or hub configured to connect the RFID readers to the processing circuitry.

3. The system of claim 1, wherein the module identifiable information from the RFID tag of the electronic equipment module includes a unique identifier (UID) of the electronic equipment module, and system further comprises the computer that is configured to access information about the electronic equipment module using the UID.

4. The system of claim 1, wherein the module identifiable information from the RFID tag of the electronic equipment module includes one or more of a make, a model, a serial number, a description of the electronic equipment module, or a description of one or more components of the electronic equipment module.

5. The system of claim 1, wherein the processing circuitry is configured to cause the RFID readers to radiate interrogation signals periodically.

6. The system of claim 1, wherein the rack includes a door configured to allow access to the mount positions, and a sensor configured to detect when the door is opened and generate a corresponding signal, and
wherein the processing circuitry is configured to receive the corresponding signal, and in direct response thereto, cause the RFID readers to radiate respective interrogation signals, or change a frequency at which the RFID readers radiate respective interrogation signals.

7. The system of claim 1 further comprising a motion sensor located in an area including the rack, and configured to detect motion in the area and generate a corresponding signal, and
wherein the processing circuitry is configured to receive the corresponding signal, and in direct response thereto, cause the RFID readers to radiate the respective interrogation signals, or change a frequency at which the RFID readers radiate the respective interrogation signals.

8. The system of claim 1, wherein the rack, the RFID reader array and the processing circuitry are components of a rack assembly, and the system comprises a plurality of rack assemblies, and
wherein the second signal further includes rack identifiable information, and the computer configured to locate the electronic equipment module includes the computer configured to locate the electronic equipment in the rack and at the mount position, from respectively the rack identifiable information and the mount position identifiable information.

9. The system of claim 8, wherein the system further comprises the computer configured to communicate inventory information including at least some of the module identifiable information, the rack identifiable information and the mount position identifiable information to an inventory management system configured to track inventory of electronic equipment modules mounted in the plurality of rack assemblies.

10. The system of claim 9, wherein the system further comprises the inventory management system that is configured to implement a distributed ledger that is replicated, shared and synchronized across a plurality of nodes on a peer-to-peer network, and
wherein the inventory management system is configured to record the inventory information in an immutable entry in the distributed ledger.

11. The system of claim 8, wherein the system further comprises the computer configured to communicate product lifecycle information including at least some of the module identifiable information, the rack identifiable information and the mount position identifiable information to a product lifecycle management system configured to identify and localize the electronic equipment modules at different points of time during a lifecycle of the electronic equipment modules.

12. The system of claim 11, wherein the system further comprises the product lifecycle management system that is configured to implement a distributed ledger that is replicated, shared and synchronized across a plurality of nodes on a peer-to-peer network, and
wherein the product lifecycle management system is configured to record the product lifecycle information in an immutable entry in the distributed ledger.

13. A method of autonomously identifying and locating electronic equipment modules in a rack including mount positions configured to accept the electronic equipment modules that are rack mountable, the electronic equipment modules equipped with respective radio-frequency identification (RFID) tags on which respective module identifiable information for the electronic equipment modules are stored, the method comprising:
causing an RFID reader of an RFID reader array to radiate an interrogation signal within a read field of the RFID reader, the RFID reader array extending across the mount positions of the rack, the RFID reader array including RFID readers that are separate and distinct, each RFID reader associated with a respective mount position, including a directional antenna that is configured to radiate toward the respective mount position, and having the read field that among the mount positions extends into only the respective mount position;
receiving module identifiable information at the RFID reader associated with a mount position, from an RFID tag of an electronic equipment module mounted at the mount position;
transmitting a signal including the module identifiable information and mount position identifiable information, from the RFID reader to processing circuitry; and
transmitting a second signal including at least the module identifiable information and the mount position identifiable information, from the processing circuitry to a computer configured to identify the electronic equipment module from the module identifiable information, and locate the electronic equipment module at the mount position from the mount position identifiable information.

14. The method of claim 13, wherein the RFID reader array further comprises a backplane or hub configured to connect the RFID readers to the processing circuitry, and causing the RFID reader to radiate the interrogation signal includes the processing circuitry instructing the RFID reader via the backplane or hub.

15. The method of claim 13, wherein the module identifiable information from the RFID tag of the electronic equipment module includes a unique identifier (UID) of the electronic equipment module, and the method further comprises the computer accessing information about the electronic equipment module using the UID.

16. The method of claim 13, wherein the module identifiable information from the RFID tag of the electronic equipment module includes one or more of a make, a model, a serial number, a description of the electronic equipment module, or a description of one or more components of the electronic equipment module.

17. The method of claim 13 further comprising causing the RFID readers to radiate interrogation signals periodically.

18. The method of claim 13, wherein the rack includes a door configured to allow access to the mount positions, and the method further comprises:
   detecting when the door is opened; and in direct response thereto,
   causing the RFID readers to radiate respective interrogation signals, or change a frequency at which the RFID readers radiate the respective interrogation signals.

19. The method of claim 13 further comprising:
   detecting motion in an area including the rack; and in direct response thereto,
   causing the RFID readers to radiate the respective interrogation signals, or change a frequency at which the RFID readers radiate the respective interrogation signals.

20. The method of claim 13, wherein the rack, the RFID reader array and the processing circuitry are components of a rack assembly of a plurality of rack assemblies, and
   wherein the second signal transmitted from the processing circuitry to the computer further includes rack identifiable information, and the computer configured to locate the electronic equipment module includes the computer configured to locate the electronic equipment module in the rack and at the mount position, from respectively the rack identifiable information and the mount position identifiable information.

21. The method of claim 20 further comprising the computer communicating inventory information including at least some of the module identifiable information, the rack identifiable information and the mount position identifiable information to an inventory management system configured to track inventory of electronic equipment modules mounted in the plurality of rack assemblies.

22. The method of claim 21 further comprising:
   implementing a distributed ledger that is replicated, shared and synchronized across a plurality of nodes on a peer-to-peer network; and
   recording the inventory information in an immutable entry in the distributed ledger.

23. The method of claim 20 further comprising the computer communicating product lifecycle information including at least some of the module identifiable information, the rack identifiable information and the mount position identifiable information to a product lifecycle management system configured to identify and localize the electronic equipment modules at different points of time during a lifecycle of the electronic equipment modules.

24. The method of claim 23 further comprising:
   implementing a distributed ledger that is replicated, shared and synchronized across a plurality of nodes on a peer-to-peer network; and
   recording the product lifecycle information in an immutable entry in the distributed ledger.

* * * * *